United States Patent
Sun et al.

[19]

[11] Patent Number: 6,167,556
[45] Date of Patent: Dec. 26, 2000

[54] SYSTEM FOR LOGIC EXTRACTION FROM A LAYOUT DATABASE

[75] Inventors: Albert C. Sun; Chee-Horng Lee, both of Taipei; Chang-Lun Chen; Chun-hao Li, both of Hsinchu, all of Taiwan

[73] Assignee: Macronix International Co., Ltd., Hsinchu, Taiwan

[21] Appl. No.: 09/029,119

[22] PCT Filed: Oct. 14, 1997

[86] PCT No.: PCT/US97/18844

§ 371 Date: Feb. 23, 1998

§ 102(e) Date: Feb. 23, 1998

[87] PCT Pub. No.: WO99/19818

PCT Pub. Date: Apr. 22, 1999

[51] Int. Cl.[7] .................................................. G06F 17/50
[52] U.S. Cl. .......................................... 716/3; 716/2; 716/7
[58] Field of Search .......................... 395/500.02–500.19, 395/500.35–500.37; 716/1–21; 703/14–16

[56] References Cited

U.S. PATENT DOCUMENTS

| | | | |
|---|---|---|---|
| 5,210,699 | 5/1993 | Harrington | 716/5 |
| 5,416,717 | 5/1995 | Miyama et al. | 703/14 |
| 5,463,561 | 10/1995 | Razdan | 716/5 |
| 5,995,734 | 11/1999 | Saika | 716/9 |
| 6,077,308 | 6/2000 | Carter et al. | 716/8 |

OTHER PUBLICATIONS

Shiran ("Reverse engineering as a framework for design verification", IEEE International Symposium on Circuits and Systems, 1989, vol. 2, pp. 969–972, May 8, 1989).

Liao et al. ("Boolean behavior extraction from circuit layout", Proceedings of Technical Papers, 1989 International Symposium on VLSI Technology, Systems and Applications, 1989, May 17, 1989 pp. 139–143).

Dukes et al. ("A generalized extraction system for VLSI", Proceedings, Fourth Annual IEEE International ASIC Conference and Exhibit, 1991, Sep. 23, 1991, pp. P4–8/1–4).

Yoon et al. ("A VLSI circuit extractor with a parallel algorithm", 1994 IEEE Asia–Pacific Conference on Circuits and Systems, APCCAS '94, Dec. 5, 1994, pp. 306–310).

Laurentin, M. et al. ("DESB, a Functional Abstractor for CMOS VLSI Circuits", IEEE Comput. Soc. Press, European Design Automation Conference, EURO–VHDL '92, Sep. 7, 1992, pp. 22–27).

Boehner, M. ("LOGEX—an Automatic Logic Extractor from Transistor to Gate Level for CMOS Technology", IEEE, 1988 Proceedings of the 25th ACM/IEEE Design Automation Conference, Jun. 12, 1988, pp. 517–522).

Krol. J., "CIRCOR—An Expert System for Fault Correction of Digital NMOS Circuits", IEE, European Conference on Circuit Theory and Design, Sep. 5, 1989, pp. 674–676.

Bryant, R.E., "Extraction of Gate Level Models from Transistor Circuits by Four–valued Symbolic Analysis", IEEE, Comput. Soc. Press, 1991 IEEE International Conference on Computer–Aided Design, Digest of Technical Papers, Nov. 11, 1991, pp. 350–353.

Hsieh, Y.C. et al., "LiB: A Cell Layout Generator", IEEE, 1990 Proceedings of the 27th ACM/IEEE Design Automation Conference, Jun. 4, 1990, pp. 474–479.

*Primary Examiner*—Paul R. Lintz
*Assistant Examiner*—Phallaka Kik
*Attorney, Agent, or Firm*—Mark A. Haynes; Haynes & Beffel LLP

[57] ABSTRACT

A system and process for logic extraction from the layout of logic blocks is described. Logic design information is extracted from a transistor level net list which is stored in a memory. The transistor level net list in turn is generated from a layout polygon database using techniques in the art. The process comprises processing the transistor level net list in the memory to define groups of transistors according to whether or not transistors in the transistor level net list are connected to a supply voltage, whether or not transistors in the transistor level net list are connected to a reference voltage and the transistor type. The groups of transistors are analyzed according to their interconnections, and their membership in groups. Finally, logic units are identified in response to the step of analyzing the groups of transistors.

40 Claims, 13 Drawing Sheets

SYSTEM FOR LOGIC EXTRACTION FROM
A LAYOUT DATABASE

BACKGROUND OF THE INVENTION

1. Field of the Invention

The present invention relates to automated design of integrated circuits, and more particularly to the extraction of a logic design from a layout database or a transistor level net list of a logic block.

2. Description of Related Art

Integrated circuits often include complex logic blocks. The design and implementation of such logic blocks is a difficult and time consuming task. It is often desirable to use logic blocks which have been successfully implemented in old integrated circuits, in a new product. For example, a new product that might be more highly integrated including more functions on a single chip, or a new product made using more modem process technologies, may be desired in which a logic block implemented in an old integrated circuit could be directly applied.

However, logic blocks in old integrated circuits often only exist in a physical form. Thus, there is no description of the logic implemented by the logic block at a level of sufficient detail to allow it to be readily ported to a new product or a new process technology. There are existing products on the marketplace that are able to translate a polygon layout description of an integrated circuit into a transistor level net list. See for example, Design Rule Enforcement and Migration DREAM, provided by Sagantec Israel Ltd., of Haifa, Israel. However, the transistor level net list is still insufficient to provide source material for porting the logic block to new process technologies in many circumstances. Also, higher level description of the logic block is necessary to allow hardware emulation and critical path enhancement which might be necessary for successfully porting the old logic block to a new process technology, or to systems requiring different clock rates or other changing parameters of operation.

Accordingly, there is a need for a technique for extracting a logic gate level description of a logic block from a layout database or from a transistor level net list generated from a layout database. Such a technique would enable the recover of substantial intellectual property embodied by layout blocks in older integrated circuit designs. Furthermore, the technique will allow implementation of old designs with denser and faster processes, and with improved characteristics to fit new environments of use.

SUMMARY OF THE INVENTION

The present invention provides a system and process for logic extraction from the layout of logic blocks. Logic design information is extracted from a transistor level net list which is stored in a memory. The transistor level net list in turn is generated from a layout polygon database using techniques available in the art. The process comprises processing the transistor level net list in the memory to define groups of transistors according to a connection or not to a supply voltage, a connection or not to a reference voltage and the transistor type. The groups of transistors are analyzed according to their interconnections, and their membership in groups. Finally, logic units are identified in response to the step of analyzing the groups of transistors.

For example, the groups of transistors include a first group of transistors of a first type, such as p-channel MOS transistors, having a source node coupled to a supply voltage, such as a $V_{DD}$ supply voltage, a second group of transistors of the first type, such as the p-channel MOS transistors, having a source node that is not coupled to a supply voltage, a third group of transistors of a second type, such as a n-channel MOS transistor, having a source node not coupled to a reference voltage such as ground or a $V_{SS}$ supply voltage, and a fourth group of transistors of the second type having a source node coupled to a reference voltage. The groups are analyzed by determining for at least one of said groups of transistors, respective interconnected sets of transistors for particular transistors in said one group. The respective sets include the particular transistor, and transistors from the first through fourth groups for which at least one of the sources and drains of the transistors in said respective sets are coupled to at least one of the sources and drains of other transistors in said respective sets. The logic units are identified by determining subsets of transistors in said respective sets which consist of transistors in one of said groups which share a gate terminal with a transistor in another said groups. The subsets of transistors are classified as logic units. The step of classifying includes classifying a subset as an inverter if the subset consists of one transistor from the first group, and one transistor from the fourth group. The step of classifying includes classifying a subset as a NAND gate having n inputs, if the subset consists of n transistors from the first group, n−1 transistor(s) from the third group and one transistor from the fourth group. The step of classifying includes classifying a subset as a NOR gate having n inputs, if the subset consists of one transistor from the first group, n−1 transistor(s) from the second group, and n transistors from the fourth group. Thus, the process according to the present invention is capable of classifying subsets of transistors as inverters, NAND gates, NOR gates and other combinational logic gates. Further processing includes classifying subsets of inverters, NAND gates and NOR gates as latches and flip-flops. Other transistors in said respective sets are classified as pass gates.

In a preferred system, the process results in producing a computer readable, gate level description of the logic block in response to the identified logic units. From the gate level description, high level synthesis and redesign can be implemented.

The present invention can also be characterized as a system for extraction of a logic design information from a transistor level net list stored in memory. The system comprises data processing resources which process the transistor level net list in the memory to define groups of transistors in the transistor level net list. The groups of transistors are categorized according to connection or not to a supply voltage, connection or not to a reference voltage and the transistor type. The system also includes data processing resources which analyze the groups of transistors according to the interconnections in the respective groups to define interconnected sets of transistors. Finally, the data processing resources are included which identify logic units in response to the interconnected sets of transistors. The data processing resources execute the processes outlined above to produce a gate level description of the logic block defined by the transistor level net list.

In one embodiment of the invention, the process for extraction of a logic design inform ation is applied to a transistor level net list for a complementary metal-oxide silicon CMOS logic block. According to this aspect, the process includes processing with data processing resources the transistor level net list in the memory to define groups of transistors. The groups include a first group consisting of p-channel MOS transistors having source terminals coupled to a $V_{DD}$ supply voltage, a second group consisting of p-channel MOS transistors having source terminals not coupled to a $V_{DD}$ supply voltage, a third group of n-channel MOS transistors having source terminals not coupled to a $V_{SS}$ reference voltage, and a fourth group consisting of n-channel MOS transistors having source terminals coupled to a $V_{SS}$ reference voltage. The process includes determining for at least one of said groups, such as the first group, respective sets of transistors for each particular transistor in the first group. The respective sets include the particular transistor from the first group, and transistors from the first through fourth groups for which at least one of the sources and drains of the transistors are coupled with at least one of the sources and drains of other transistors in the respective sets. Furthermore, the process includes determining subsets of transistors in the respective sets which consist of transistors in one of said groups which share a gate terminal with a transistor in another said groups. The respective subsets are classified as logic units using the techniques outlined above.

Accordingly, a process and system is provided based on an algorithm for generating a logic level description of a logic block from a transistor level net list or lower layer description (e.g. layout polygon) of the logic block. This process enables implementation of a virtual fab concept whereby old logic blocks can be readily ported to new products and new fabrication processes by an automated technology, without requiring large amounts of human engineering. For example, products designed for one layer of metal can be ported to multilayer metal designs, or for use with design databases adapted for particular labs, automatically.

Other aspects and advantages of the present invention can be seen upon review of the figures, the detailed description and the claims which follow.

DETAILED DESCRIPTION

Figure 1:
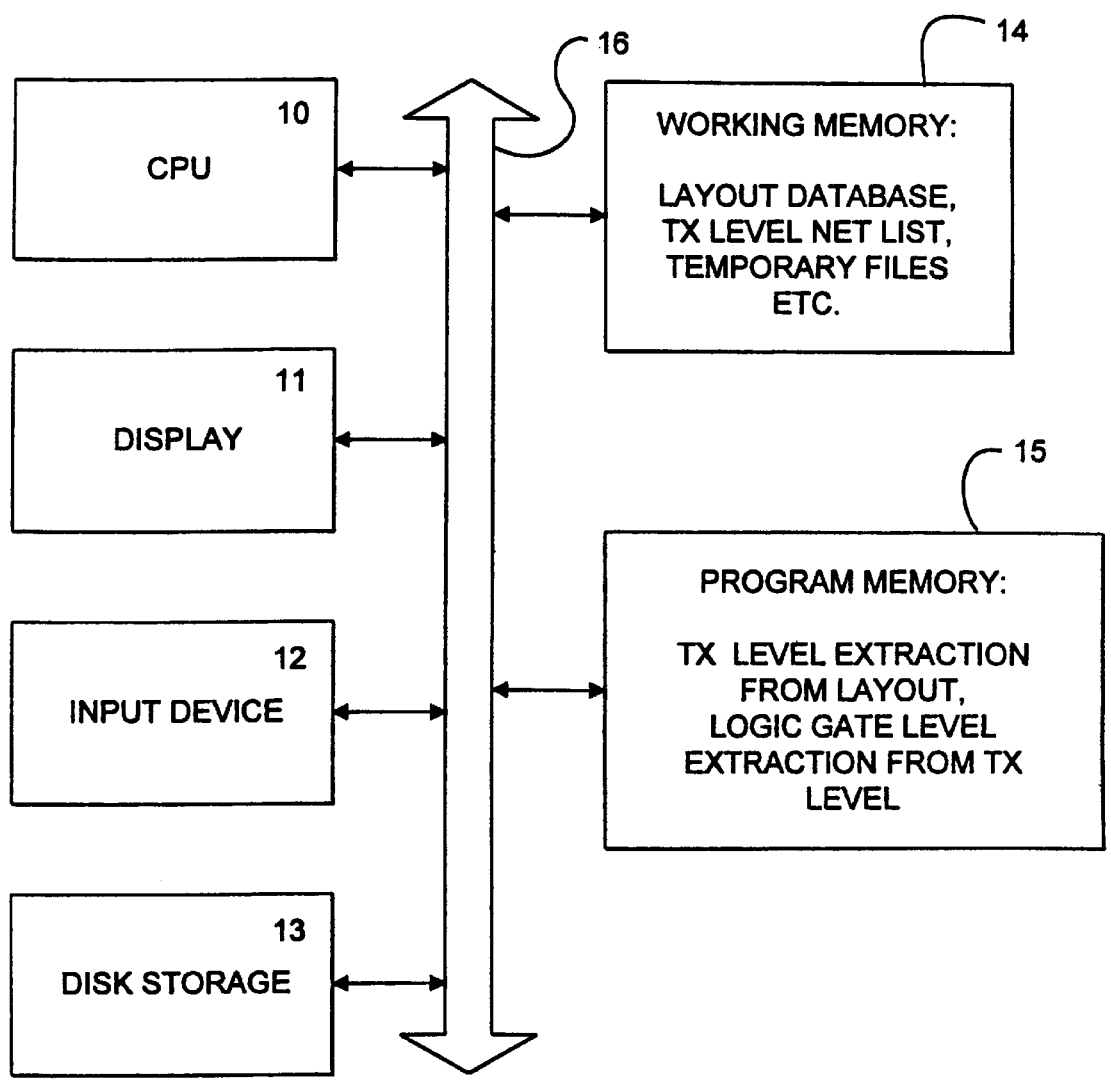
FIG. 1 is a schematic diagram of a system including a logic extraction process of the present invention.

A detailed description of a preferred embodiment of the present invention is provided with respect to FIGS. 1–13, in which FIG. 1 illustrates a system for executing the processes of the present invention, and FIGS. 2–13 illustrate processes executed by the system.

FIG. 1 is a simplified block diagram of a computer system that includes data processing resources for executing the processes of the present invention. The computer system includes a central processing unit 10, a display 11, an input device 12 such as a keyboard, non-volatile storage such as a disk storage system 13, working memory 14, and program memory 15. All of these elements are interconnected by a system bus 16 as known in the art.

The system of FIG. 1 includes data processing resources in hardware and software. The program memory stores processes for transistor level extraction from a layout database, such as a process based on the DREAM system referred to above. Also, the program memory stores software for logic gate level extraction from a transistor level net list according to the present invention.

The working memory stores the layout database for the logic block subject of the analysis. Also, it stores the transistor level net list which is generated by the transistor level extraction process, or supplied from an external source. Working memory 14 is used for storing temporary files needed by the programs for performing the extraction.

FIG. 1 is a simplified diagram meant to represent any one of a variety of computer systems which are commercially available, such as systems based on Intel microprocessors and Microsoft operating systems, systems based on Apple Macintosh architectures, and workstations provided by Sun Microsystems, and a variety of other computer platforms.

FIGS. 2–13 illustrate the processes executed by the computer system of FIG. 1 to perform logic extraction.

Figure 2:
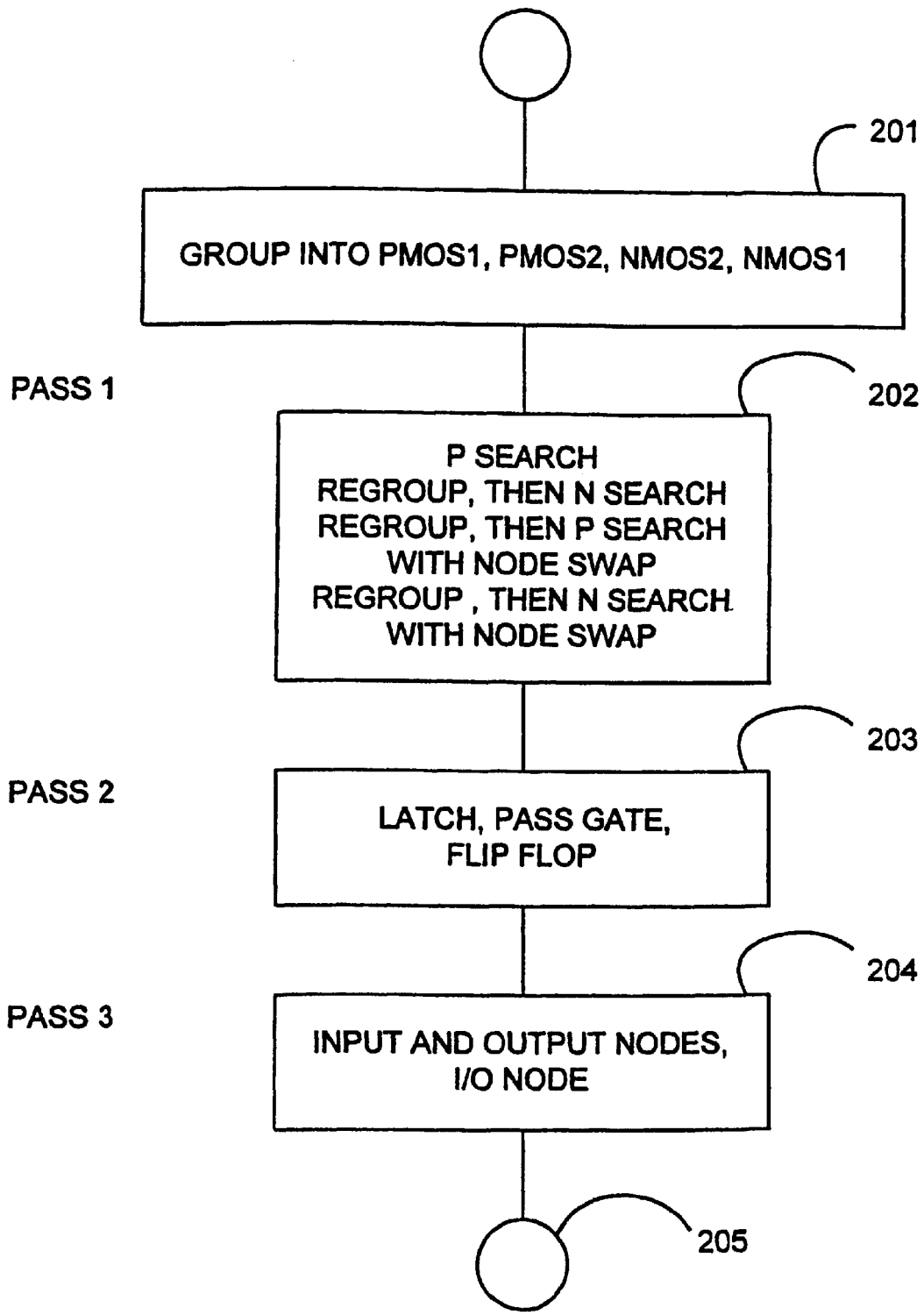
FIG. 2 is a simplified flow chart of the logic extraction process according to the present invention.
Figure 5:
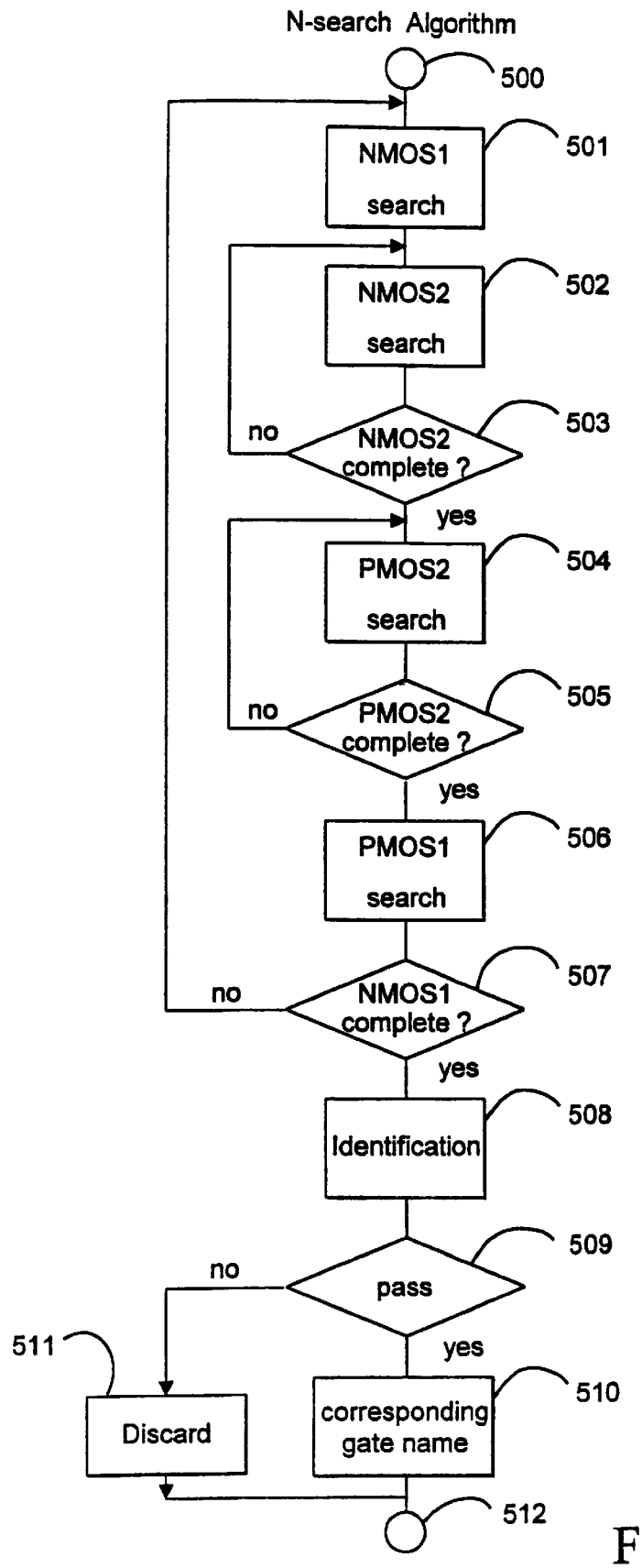
FIG. 5 is a flow chart of a process for determining sets of transistors interconnected with a n-channel transistor having a source terminal coupled to a ground reference.
Figure 6:
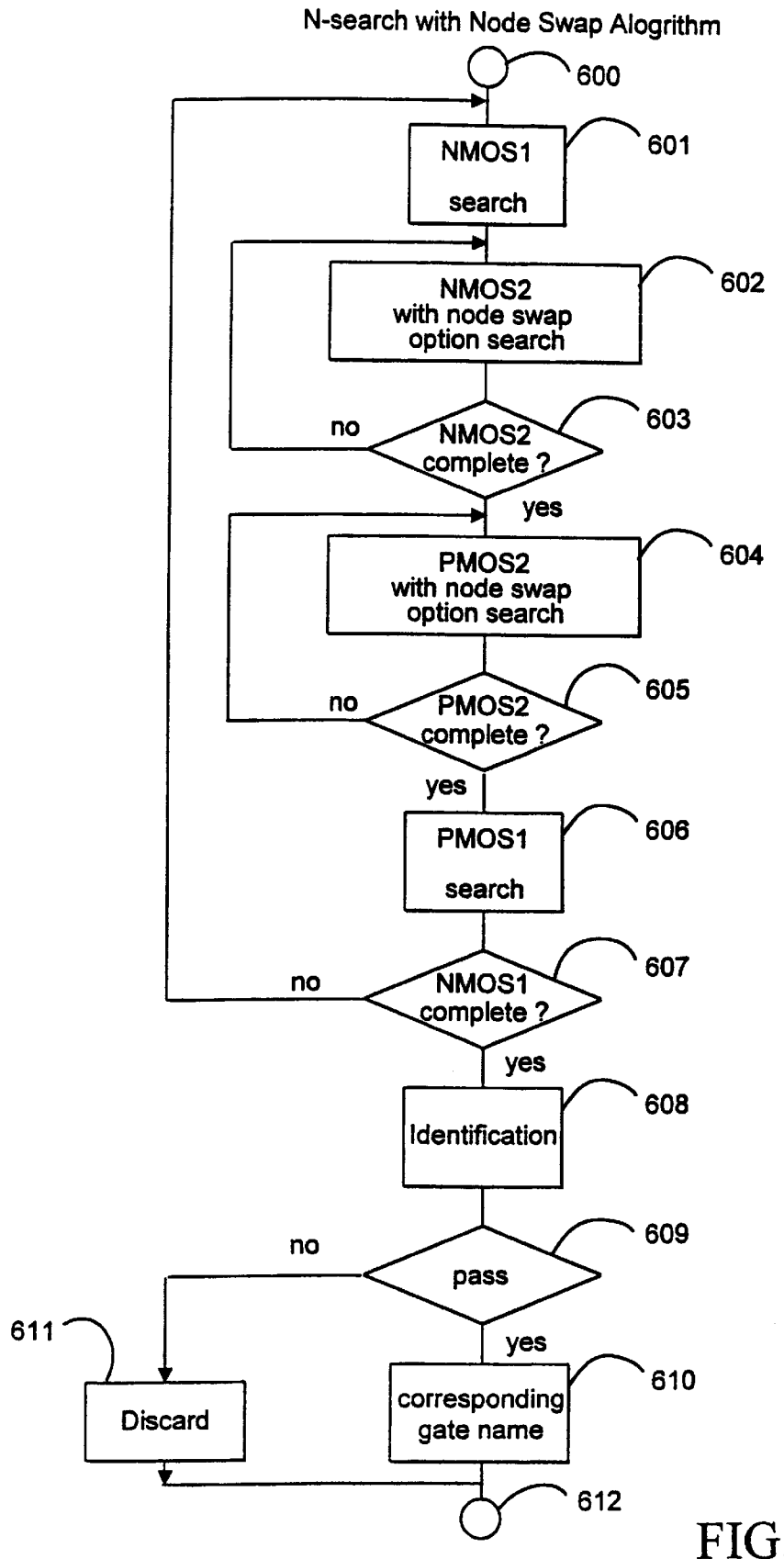
FIG. 6 is a flow chart of a process for determining sets of transistors interconnected with a n-channel transistor having a source coupled to a ground reference, where the transistor level net list optionally swaps the source and drain terminals of transistors in the net list.

First, a transistor level net list is generated using the extraction system from a layout database, or otherwise provided to the system. Next, the process of logic extraction begins as illustrated in FIG. 2 at point 201 by grouping the transistors into categories PMOS1, PMOS2, NMOS2 and NMOS1 as described below. In the first pass, the p-channel search is done (FIG. 3); the remaining transistors are regrouped and n-channel search is done (FIG. 5); the remaining transistors are regrouped, and p-channel search with node swap is done (FIG. 4); and finally the remaining transistors are regrouped again, and n-channel search with node swap is done (FIG. 6). The output of these processes is a set of files identifying logic gates including inverters, NAND gates and NOR gates.

In the second pass through the data, illustrated at point 203 of FIG. 2 latches, pass gates, and flip-flops are identified. The processes for identifying latches, pass gates and flip-flops are described below with reference to FIGS. 7, 8,9,10 and 11.

The third pass through the data is executed to identify input and output nodes, and to identify input/output nodes at point 204 of FIG. 2. The processes for identifying input nodes, output nodes and input/output nodes are described below with reference to FIGS. 12 and 13.

After this process at point 204, the logic extraction is completed as indicated at point 205. The result of the process is a computer readable logic gate level description of the logic block under analysis. The description is suitable for high level emulation and, simulation and porting to a new layout preferably more compact, in a variety of process technologies.

As mentioned above the first pass in the extraction algorithm involves executing the processes of FIGS. 3, 4, 5 and 6. The process begins by first processing a transistor level net list which has a list of transistors of for example the following form:

INST D G S B TYPE OTHER.

Where:

INST is the instance name,

D is a field storing the drain node name,

G is a field storing the gate node name,

S is a field storing the source node name,

B is a field holding the substrate node name, where applicable

TYPE is a field storing the transistor type, whether n-channel or p-channel for MOS transistors, OTHER is a field or fields for storing additional information about the transistor available including the channel length and width, and other parameters which may be relevant to timing or the like.

From the transistor level net list, the transistors are separated into four groups. The first group PMOS1 consists of p-channel MOS transistors having a source terminal coupled to the $V_{DD}$ supply. The second group PMOS2 consists of p-channel transistors having a source terminal that is not connected to the $V_{DD}$ supply. Third group NMOS2 consists of n-channel transistors having a source terminal not connected to a $V_{SS}$ reference voltage. The fourth group NMOS1 consists of n-channel transistors having a source terminal connected to the $V_{SS}$ reference.

Figure 3:
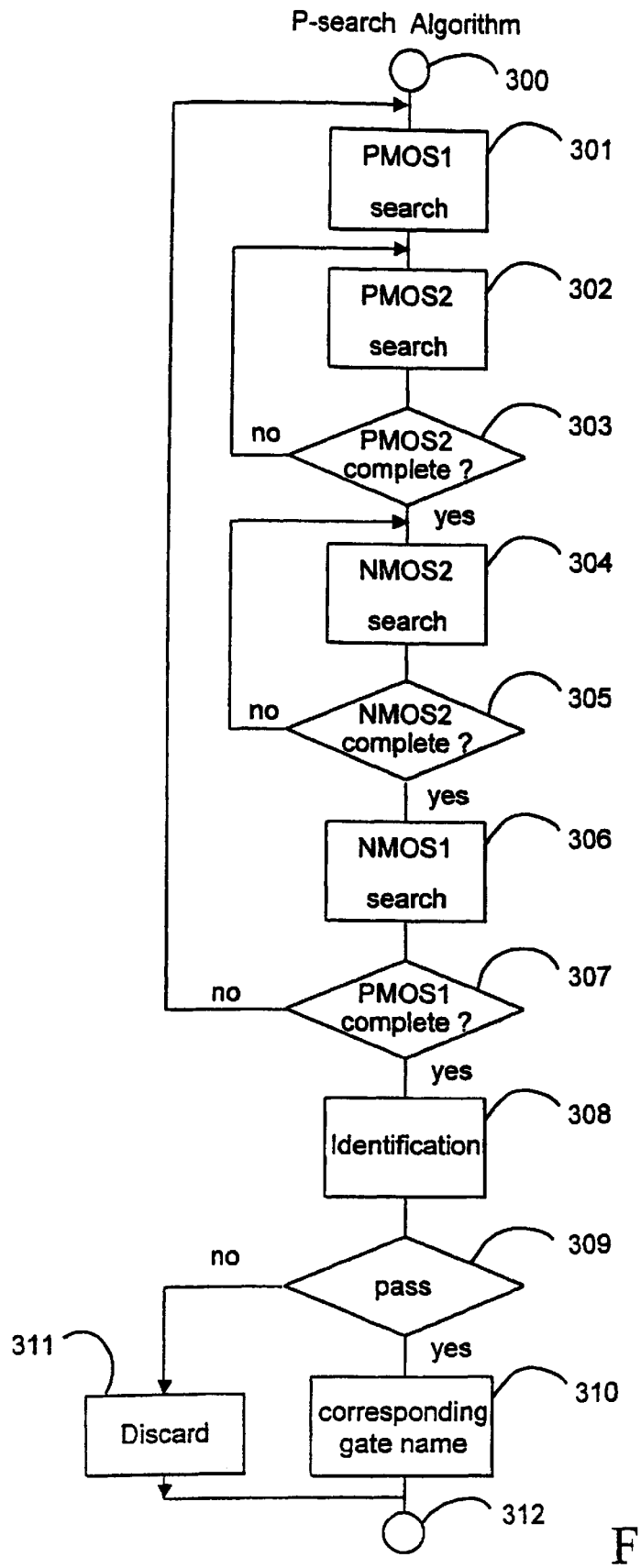
FIG. 3 is a flow chart of an algorithm for classifying sets of transistors based upon interconnection with a p-channel transistor having a source coupled to a supply terminal.

The processes of FIG. 3 are executed in one preferred approach, first. The process receives the transistor level net list (block 300). The transistors in group one PMOS1 are analyzed first. For each transistor in PMOS1, a set of interconnected transistors is generated and stored in a temporary file. The process begins by taking a drain node name as a search token for a particular transistor in PMOS1 (block 301). Next, the transistors in PMOS2 which have a source node connected to the drain node of the particular transistor are then found (block 302) and moved into the temporary file. The search taken is shifted to the drain of the PMOS2 transistor, and repeated along the end of interconnected PMOS2 transistors. This process is executed for each transistor in the second group PMOS2 (block 303). This creates a temporary file of all transistors in the PMOS2 which have a source connected to the drain of a particular transistor in the PMOS1 and all interconnected PMOS2 transistors. After all transistors in the PMOS2 are searched, the process moves to step 304 where transistors in the third group NMOS2 are found which have a drain node connected to the drain node of the particular transistor in the PMOS1, or of transistors in PMOS2 which are in the temporary file. The search taken is shifted to find interconnected NMOS2 transistors. These transistors are moved into the temporary file as they are searched (step 304). Next, it is determined whether all transistors in the NMOS2 have been analyzed (step 305). When all the transistors have been analyzed, the process moves to search transistors in the NMOS1 (step 306). If any transistors were found in the search of the third group, then the search token is shifted to the source node of the found transistor. Alternatively, it is left at the drain node of the transistor from the PMOS1 or PMOS2. Thus, transistors in the NMOS1 are found which have a drain node coupled to the drain node of the particular transistor in the PMOS1, a transistor in PMOS2 interconnected with the particular transistor or a drain node coupled to the source of a connected transistor in the NMOS2. These transistors are moved into the temporary file. This process is executed on all transistors in the NMOS1. The NMOS1 transistors at this stage are all moved to the temporary file if they are connected to the search token, and the string is finished. After all transistors in the NMOS1 have been processed, and the related transistors removed from PMOS1, PMOS2, NMOS2 and NMOS1 group files into temporary files, then the process determines whether there are other transistors in the PMOS1 (block 307). If there are, then the process loops back to block 301 until all transistors in the PMOS1 have been processed to find sets of interconnected transistors and removed from PMOS1 file.

If all transistors in the PMOS1 have been processed, then the algorithm proceeds to the identification step (block 308). The search process results in sets of transistors stored in respective temporary files, where there is one set of each p-channel transistor in the first group of transistors which have their source terminal connected to the supply voltage. These sets of transistors in the temporary files can then be analyzed to determine whether they correspond to a logic gate. This process is executed by the identification block 308 of FIG. 3. The identification process begins by taking the temporary files which contain transistors from the four groups. With any p-channel element in a temporary file, the gate is selected as a search token. According to the identification process, each temporary file is checked which contains elements from the first through fourth groups. Starting with any p-channel transistor in the temporary file, all transistors having gates interconnected with the gate of the selected transistor are found. The transistors having interconnected gates are moved into a second temporary file provide a subset of transistors. This process of identifying subsets is executed for every p-channel transistor in the set. Next, for each subset of transistors where the number of p-channel transistors is equal to the number of n-channel transistors, the subset can be identified as one of an inverter, a NAND gate or a NOR gate. The identification process is executed by a table look-up according to the following table:

| No. in subject from PMOS1 | No. in subject from PMOS2 | No. in subject from NMOS2 | No. in subject from NMOS1 | |
|---|---|---|---|---|
| 1 | 0 | 0 | 1 | inverter |
| 2 | 0 | 1 | 1 | NAND2 (two input NAND) |
| 3 | 0 | 2 | 1 | NAND3 (three input NAND) |
| 4 | 0 | 3 | 1 | NAND4 (four input NAND) |
| n | 0 | n − 1 | 1 | NANDn (n input NAND) |

-continued

| No. in subject from PMOS1 | No. in subject from PMOS2 | No. in subject from NMOS2 | No. in subject from NMOS1 | |
|---|---|---|---|---|
| 1 | 1 | 0 | 2 | NOR2 (two input NOR) |
| 1 | 2 | 0 | 3 | NOR3 (three input NOR) |
| 1 | 3 | 0 | 4 | NOR4 (four input NOR) |
| 1 | n − 1 | 0 | n | NORn (n input NOR) |

The table can be readily expanded to other types of gates, as suits a particular implementation. After executing the identification process of step 308, the process checks whether the temporary file passed identification (step 309). If it passed, the subset is assigned a gate name (step 310) and the process is done for this file (step 312). If it did not pass, then the temporary file is discarded (step 311).

Figure 4:
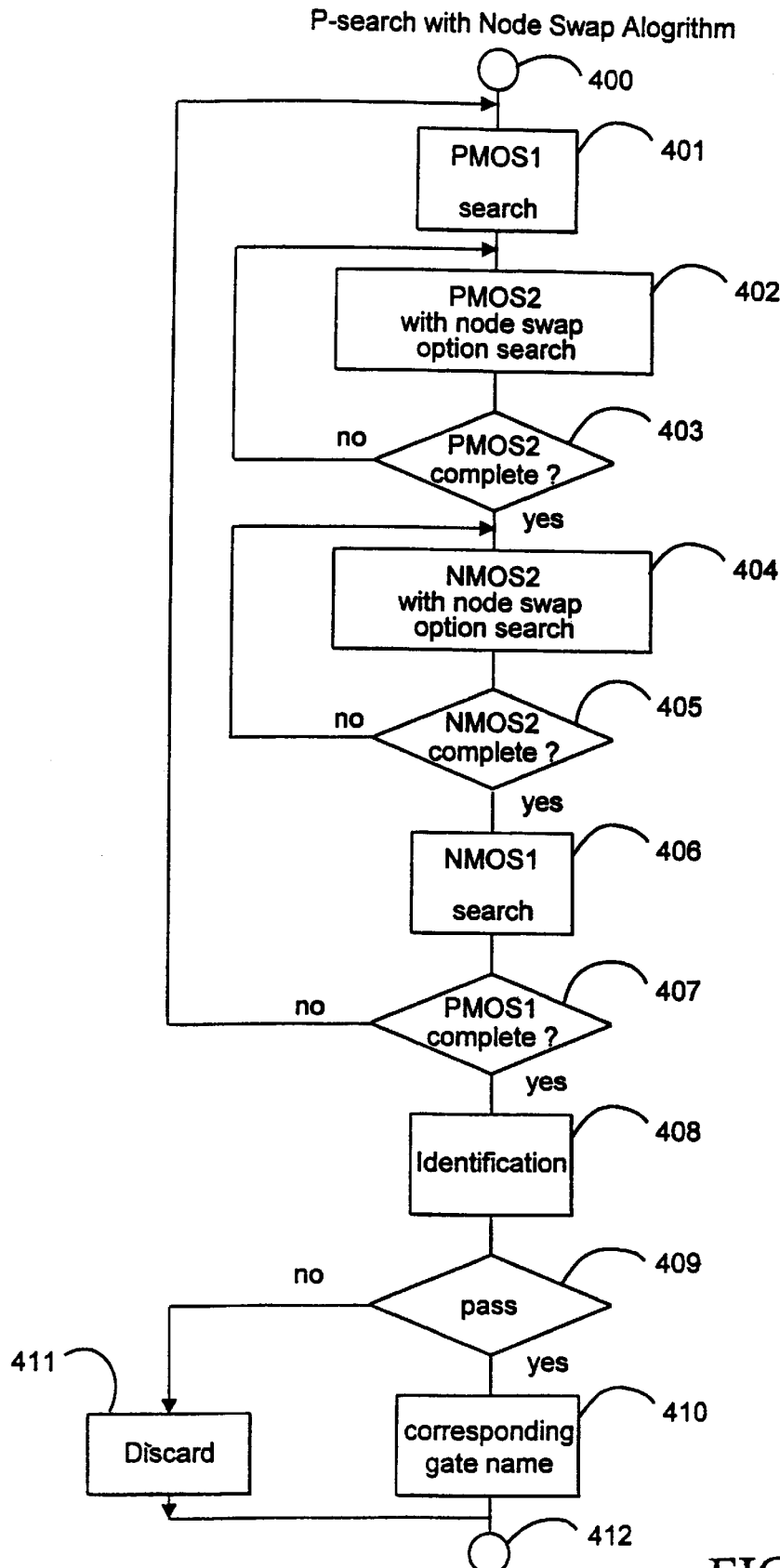
FIG. 4 is a flow chart for determining sets of transistors interconnected with a p-channel transistor having a source coupled to a supply terminal, in which the transistor level net list optionally swaps the source and drain terminals of the transistors.

Because of the search sequence beginning with transistors in PMOS1, that is p-channel transistors having a source coupled to the supply node, some groups of elements might not be collected into a recognizable subset, either because the temporary file is not recognized, or because the transistors are not gathered into a temporary file during the search. These transistors need to be reprocessed. Thus, other search options are executed as represented by FIGS. 4, 5 and 6 in order to reduce the unidentified transistors in the transistor level net list being analyzed. The process of FIG. 4 illustrates the PMOS search with a node swap option. According to this process, the algorithm begins with the transistor level net list (step 400). Next, a transistor in the first group PMOS1 is selected upon which to identify a set of interconnected transistors (step 401). Using the selected transistor, its drain node is identified as a search token. All transistors in the second group PMOS2, that is p-channel transistors not having a source connected to the supply voltage are analyzed. All the transistors in the PMOS2 which have a source connected to the drain of the particular transistor selected at step 401 are placed in a temporary file. Next, all the transistors in the second group, which have a source connected to the drain of the particular transistor selected at step 401 are placed in the temporary file. This step catches transistors where the source node and drain node have been swapped in the transistor level net list. This process with node swap option is executed for each transistor in the second group (step 402). Next it is determined whether all transistors in the second group have been searched using the node swap option (step 403). If not the process loops until all transistors in the second group are searched. After all transistors in the second group are searched, the process proceeds to step 404 where transistors in the third group NMOS2, that is n-channel transistors which do not have a source connected to the reference supply terminal, are searched with a node swap option. Thus, all n-channel transistors in NMOS2 which have a drain node coupled to the source of a transistor from PMOS2 connected to the particular transistor in PMOS1, or the drain of the particular transistor from PMOS1 are identified. Also, all transistors in NMOS2 coupled to the source or drain of a transistor in the interconnected sets of PMOS1 and PMOS2 are identified. Next a process determines whether all transistors in the NMOS2 have been searched (step 405). If not the process loops until all transistors have been searched in the third group. When all transistors in the third group have been searched, transistors in the fourth group NMOS1 are analyzed (step 406). This process finds all n-channel transistors in NMOS1 which have a drain node coupled to the search token, which is the source or drain of a transistor in the third group, a transistor in the second group, or a transistor in the first group from the interconnected set, which has been stored in the temporary file. This process is executed until all transistors in NMOS1 have been processed. When all transistors in NMOS1 have been processed and the related transistors removed to a temporary file, the process determines whether all transistors in PMOS1 have been analyzed (step 407). If not the process loops back to step 401 to select another transistor in the first group of transistors. When all transistors in the first group of transistors have been processed at step 407, the process proceeds to the identification step (step 408). Next it is determined whether the identification has been successful (step 409). If it is successful, then a gate name is applied to the set of transistors identified (step 410). If it is not successful at step 409, then the temporary file for the set of transistors is discarded (step 411). After steps 411 and 410, a computer readable list of logic gates which have been identified by the process are provided (step 412).

Additional gates can be identified by beginning a search with the fourth group of transistors NMOS1, that is n-channel transistors having their source connected to the ground reference terminal. This process is like that of FIG. 3, except beginning with the fourth group NMOS1 and working to the first group PMOS1. Thus, at step 500 the transistor level net list is received. A particular transistor in NMOS1 is selected (step 501). For the particular transistor, all transistors in NMOS2 which have a source terminal connected to the drain of the particular transistor are identified and stored in a temporary file (steps 502 and 503). Next, for each transistor in the NMOS2 connected to a particular transistor in NMOS1, all transistors in the PMOS2, are identified which have a drain terminal connected to the drain of such transistors or interconnecting transistors in PMOS2 (steps 504 and 505). Next, transistors in the PMOS1 are identified which have a drain terminal connected to the source of transistors in PMOS2 which had been found in the previous steps, or the drains of interconnected transistors in NMOS2 or NMOS1. This process continues until all transistors in the PMOS1 have been processed (step 506). Next, it is determined whether there are additional transistors in NMOS1 for analysis (step 507). If not the process is not complete, then it returns to step 501. After the process is complete, then the identification process is executed (step 508). If the set of transistors identified passes the identification process, then a gate name is applied (steps 509 and 510). If the set of transistors does not pass the identification process then the temporary file is discarded (step 511). The result at step 512 is a computer readable gate level description of the logic block, plus possibly some uncollected or unrecognized transistors.

FIG. 6 illustrates the search starting with n-channel transistors in NMOS1 with the node swap option. The process proceeds just as the process of FIG. 4, except beginning with group 4 rather than group 1. It is given similar reference numbers in the 600 series, and not redescribed here.

The result of the processes of FIGS. 3–6 is a computer readable gate level description of those sets of transistors which can be classified as inverters, NAND gates and NOR gates. Other logic units can also be found in the logic block including latches, pass gates, flip-flops, input nodes, output nodes and input/output nodes. Processes for identifying these logic units are described with reference to FIGS. 7–13.

Figure 7:
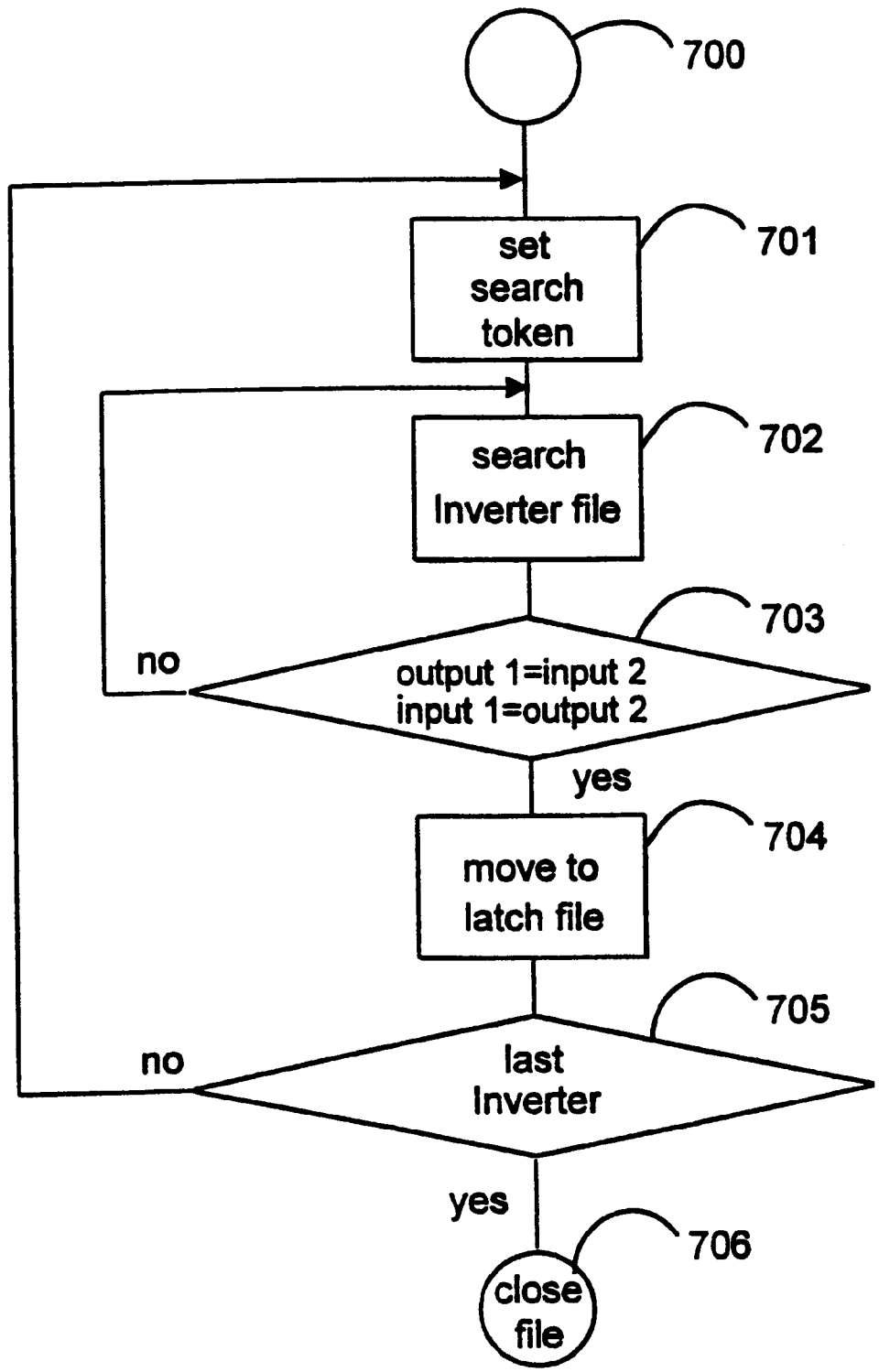
FIG. 7 is a flow chart for identifying latches from the set of inverters identified according to the processes of FIGS. 2–6.

The process of FIG. 7 identifies latches. Latches consist of inverters which are coupled in a feedback relationship. Thus the process begins at step 700 receiving the names of inverters in the logic block which have been identified in previous processing. Search token is set as the input of a first inverter the process determines whether there are other inverters in the file which have outputs connected to the input of the first inverter, and which have inputs connected to the output of the first inverter. Thus the process sets a search token at step 701 equal to the input of a first inverter in the inverter file. The remaining inverters in the inverter file are searched one at a time (step 702). If the output of the first inverter is equal to the input of the second inverter and the input of the first inverter is equal to the output of the second inverter, then the pair of inverters is stored in a latch file (step 704). If they do not match, then the process search loops to block 702 to look for other inverters which match the selected inverter. After step 704, the process determines whether all the inverters in the file have been analyzed. If not, the process loops back to step 701. If the last inverter has been analyzed at step 705, then the process is complete and a computer readable list of latches is generated and the file is closed.

Figure 8:
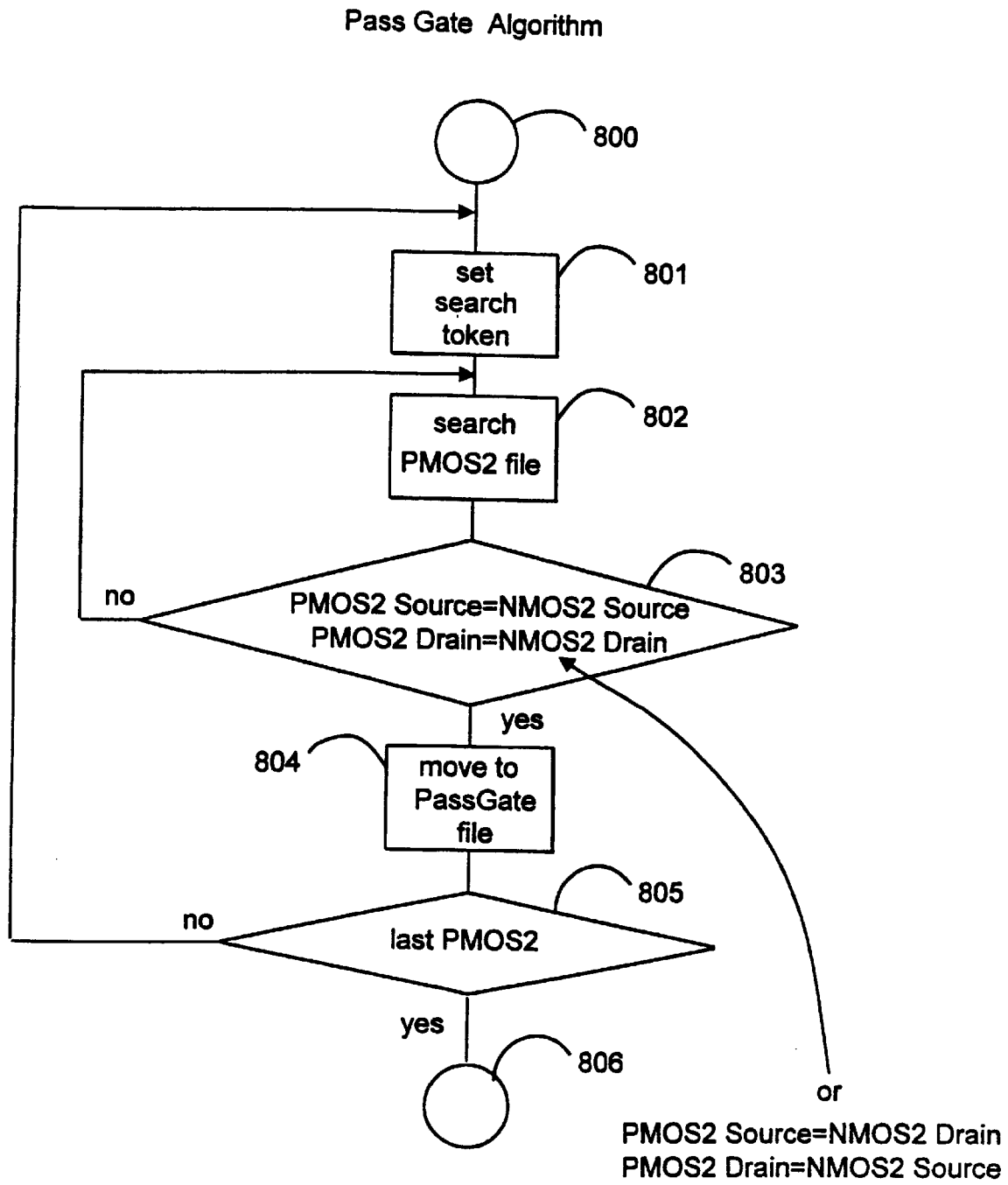
FIG. 8 illustrates the process for identifying pass gates for transistors in the sets of transistors based on first searching based on p-channel transistors.

FIG. 8 illustrates the process for identifying pass gates in the logic block. This process begins with all transistors in the group of p-channel transistors which do not have a source terminal connected to the supply voltage. This consists of the second group PMOS2 of transistors. Thus the input at block 800 is the transistor level net list. The search token is set for a first transistor in PMOS2 (step 801). For each transistor in PMOS2, search tokens are set for its source and drain (step 802). The transistor level net list is searched to find NMOS transistors which have a source connected to the source of the selected p-channel transistor and a drain connected to the drain of the selected p-channel transistor, or alternatively having a drain connected to the source of the p-channel transistor or having a source connected to the drain of the p-channel transistor. If such pair is not identified for the selected transistor, at step 803, then the process loops back to select another transistor in the PMOS2 at step 802. If a NMOS transistor is found which matches the selected p-channel, then that pair of transistors is moved to the pass gate file (step 804). Next, the process determines whether all p-channel transistors have been served as the basis of the search of step 802 (step 805) if not, the process loops back to step 801 to select another PMOS2 transistor for analysis. If the last PMOS2 transistor has been selected, then the process is finished (step 806).

Figure 9:
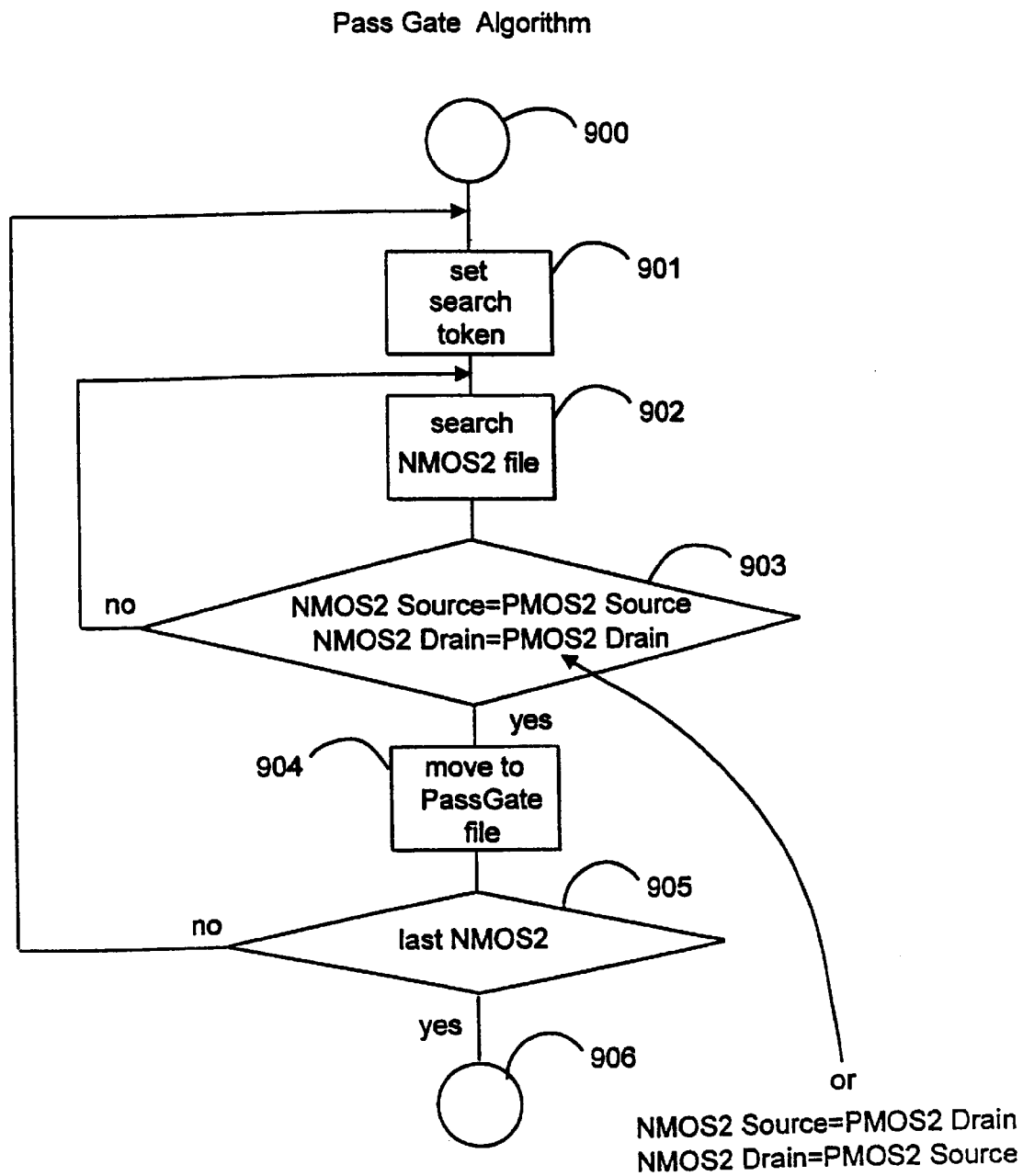
FIG. 9 is an alternative algorithm for identifying pass gates based on first searching based on n-channel MOS transistors.

FIG. 9 illustrates the algorithm for identifying pass gates by searching n-channel transistors rather than p-channels. The process is identical to the p-channel process except that it keys on n-channel transistors which do not have a source terminal connected to the reference supply, NMOS2. The algorithm of FIG. 9 is given similar reference numbers to those of FIG. 8 and not redescribed here.

Figure 10:
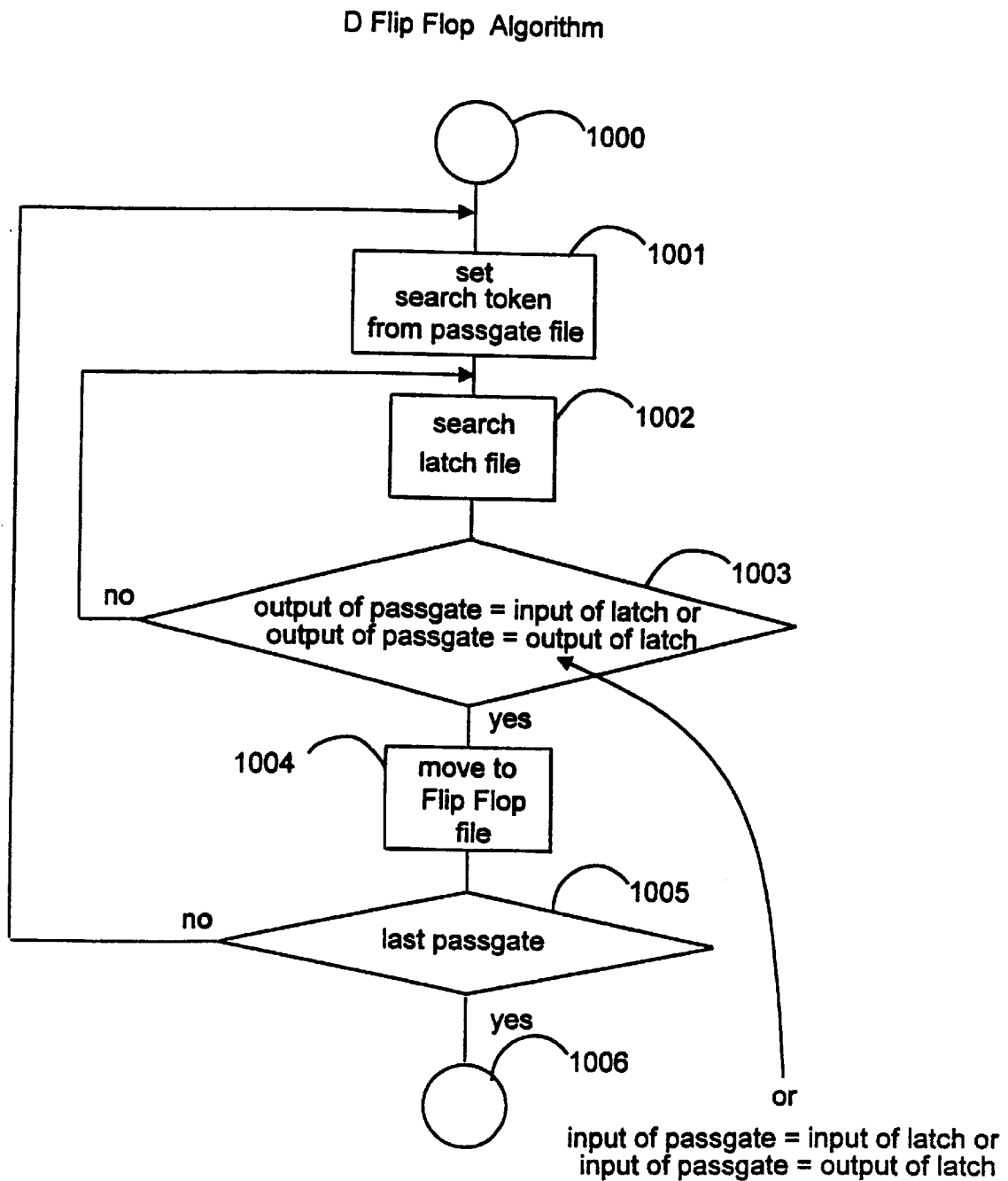
FIG. 10 illustrates a flow chart for identifying flip-flops based upon the pass gate and latch files generated by the processes of the FIGS. 7–9 based on reviewing the outputs of pass gates.
Figure 11:
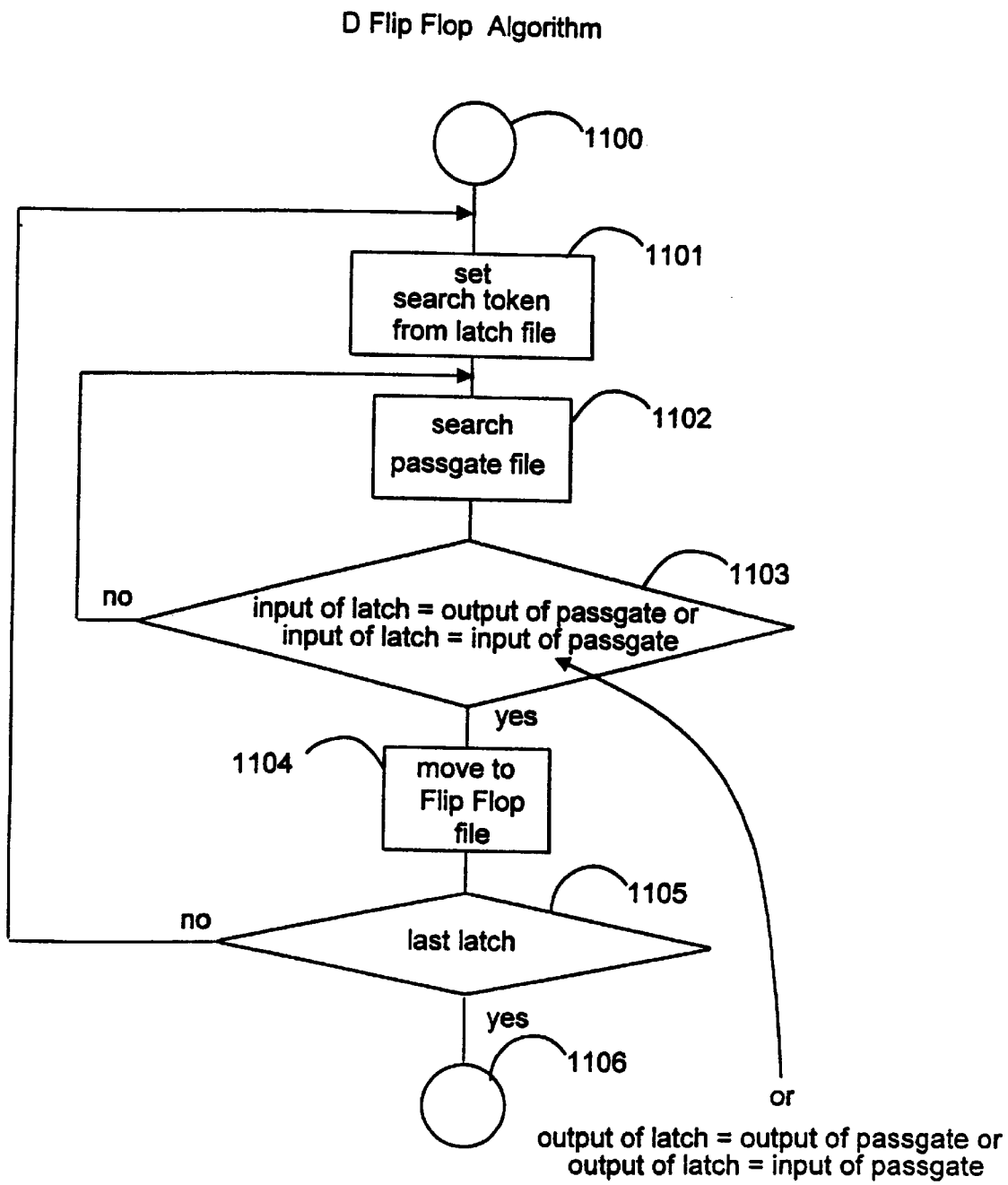
FIG. 11 illustrates the process for identifying flip-flops based upon reviewing the inputs of latches identified in the previous processes.

FIG. 10 illustrates a process of identifying D-type flip-flops based on the latch file and the pass gate file generated as described above. FIG. 10 illustrates a process when searching from the pass gate file and FIG. 11 illustrates the process when searching from the latch file. According to FIG. 10, the process begins at step 1000. A search token is set for a particular pass gate in the pass gate files step 1001. For the particular pass gate selected at step 1001, the latch file is searched one latch at a time (step 1002). For each latch, it is determined whether the output of the pass gate is equal to the input of the latch or if the output of the pass gate is equal to the output of the latch, or in the alternative the input of the pass gate equals the input of the latch or the input of the pass gate equals the output of the latch. If either test is met, then the latch and pass gate are moved to the flip-flop file (step 1004). If at step 1003, there is no match, then the process loops back to step 1002 to select other latches in the latch file until all latches are completed. After step 1004, it is determined whether the last pass gate in the pass gate file has been processed (step 1005). If not the algorithm loops back to step 1001 and selects another pass gate from the file. If the pass gate file has been completely traversed, then the process is completed (step 1006).

FIG. 11 illustrates the process for identifying D-type flip-flops when beginning from the latch file. Thus the process of FIG. 11 begins at step 1100. At step 1101, particular latch is selected from the latch file. Using the particular latch, the pass gate file is searched one unit at a time (step 1102). For each pass gate in the pass gate file it is determined whether the input of the latch equals the output of the pass gate or the input of the latch equals the input of the pass gate, or alternatively whether the output of the latch equals the output of the pass gate or the output of the latch equals the input of the pass gate (step 1103). If a match is found, then the latch pass gate pair is moved to the flip-flop file (step 1104). If a match is not found, then the process proceeds with additional pass gates in the pass gate file until a match is found. After step 1104, it is determined whether the last latch in the latch file has been processed (step 1105). If it has been processed then the algorithm is completed (step 1106). If it has not been processed, then the algorithm returns to step 1101 to analyze other latches from the latch file.

Figure 12:
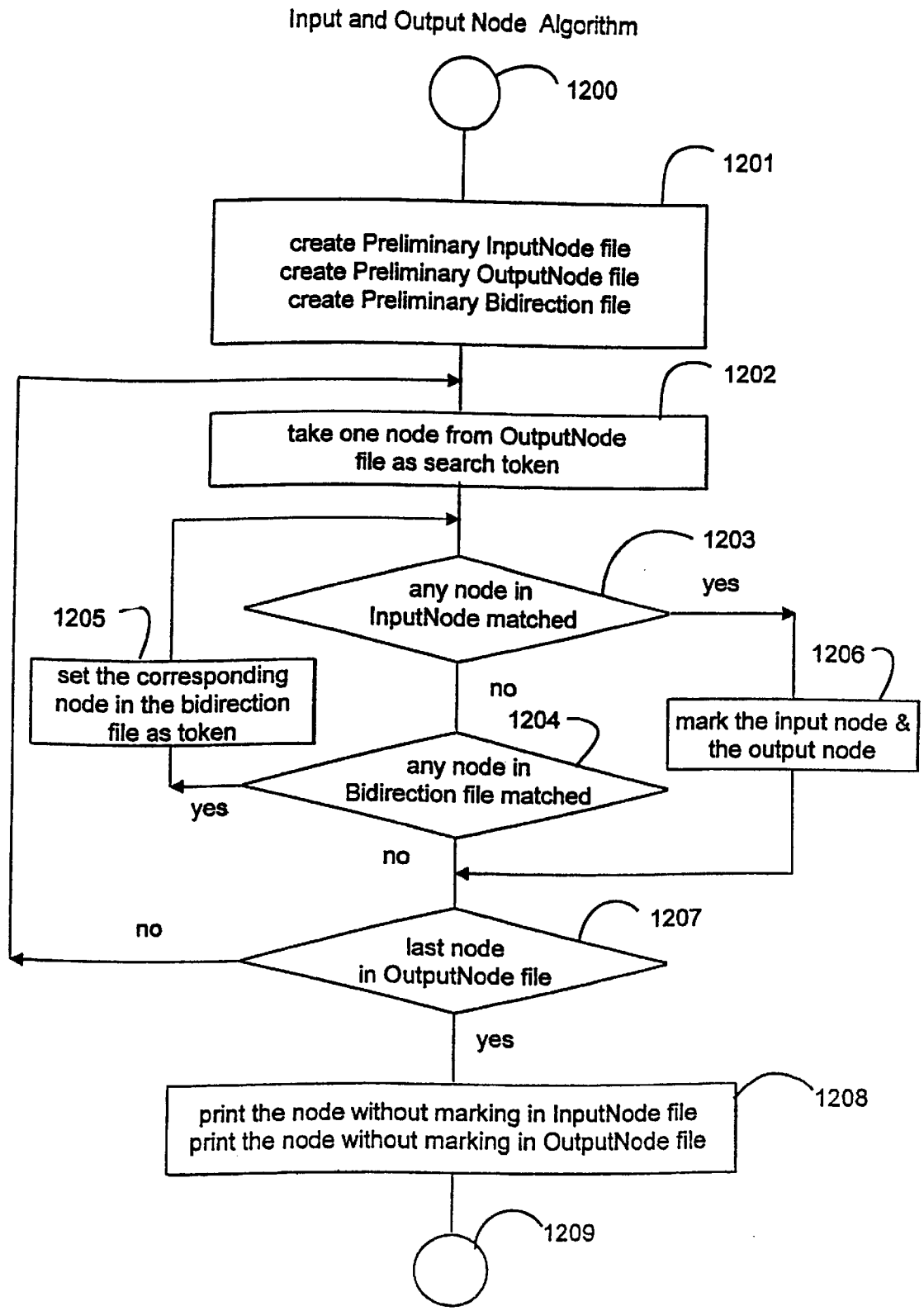
FIG. 12 illustrates the process for identifying input nodes and output nodes of a logic block.

FIG. 12 illustrates the process for identifying input and output nodes in the logic block. It serves to create a preliminary input node file, and a preliminary output node file and a preliminary bidirection file. The input node file consists of all the input nodes from the identified logic units including inverters, NAND gates and NOR gates. The output node file consists of all of the outputs for the inverters, NAND gates and NOR gates. The bidirection file consists of all the dangling transistors in the PMOS2 or NMOS2 groups, and all pass gates (step 1201). Next, a node from the output node file is selected as a search token (step 1202). Next, it is determined whether any node in the input node file matches the selected output node (step 1203). If there is no match of input and output nodes, then it is determined whether any node in the bidirection file matches the selected output node (step 1204). If a match is found in the bidirection file, then the corresponding node in the bidirection file is set as the token (step 1205) and the process loops to step 1203 to determine whether there is any node in the input file which matches the node from the bidirection file.

If at step 1203 it is determined that there is a match on the input node with the search token, which either comprises the selected output node, or a node in the bidirection file, then the input node and the output node are marked (step 1206). After marking the input and output nodes, the process loops to step 1207 where it determines whether the last node in the output node file has been analyzed. Also, if at step 1204, there is no match with the bidirection file, the process loops to step 1207. If there are other nodes to analyze, the process loops back to step 1202. If there are no other nodes to analyze, then the nodes that have not been marked in the input node file and the nodes that have not been marked in the output node file are printed or otherwise written to a computer readable file (step 1208). The process is then finished (step 1209).

Figure 13:
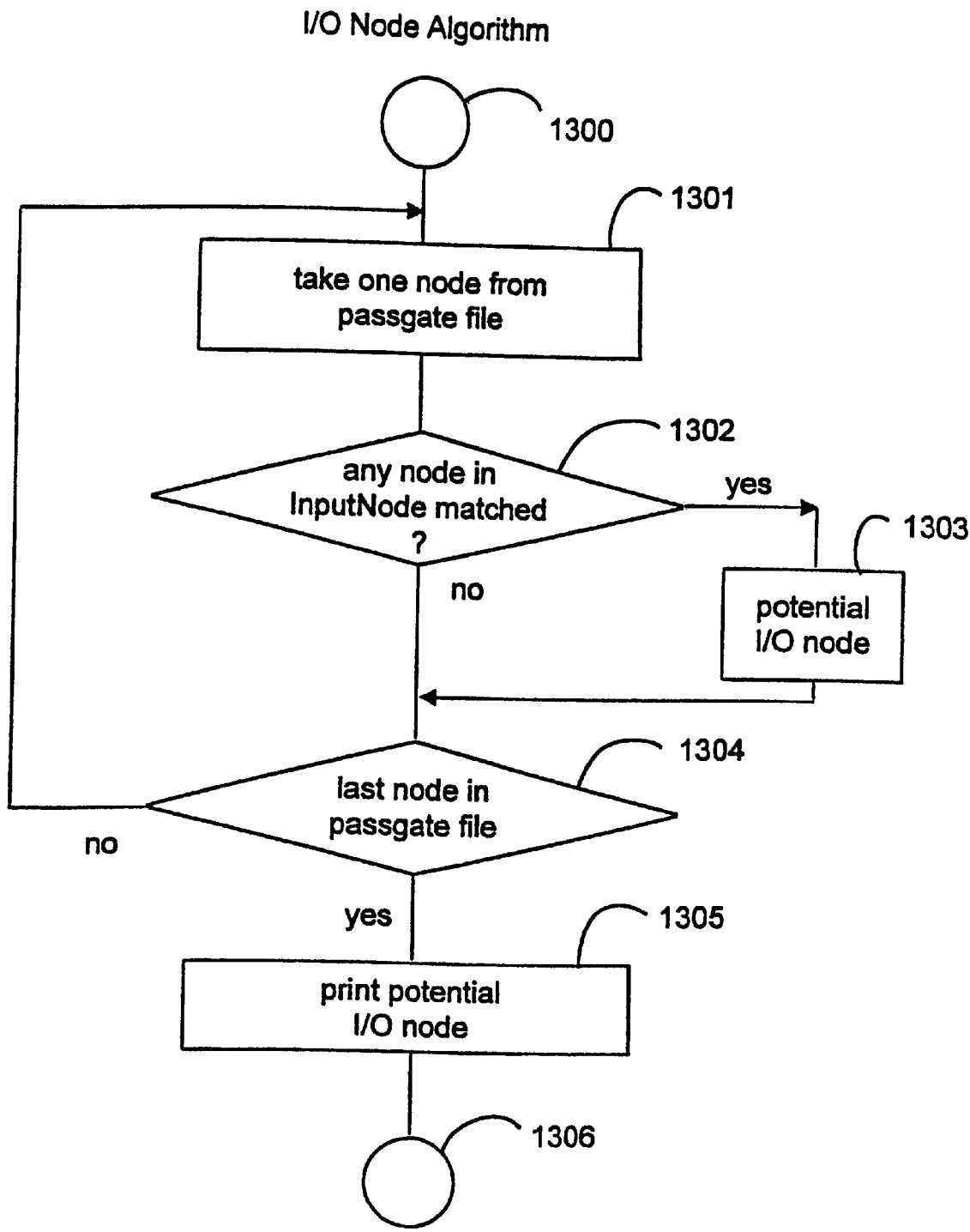
FIG. 13 illustrates the process for identifying input/output nodes in the logic block.

FIG. 13 illustrates the process of identifying input/output nodes in the logic block. The process begins at step 1300. A node from the pass gate file is selected as a search token (step 1301). For the selected node, it is determined whether there are any nodes in the input node file which match (step 1302). If any nodes in the input node file match, then the node is marked as a potential input/output node (step 1303). If there are no input nodes which match, or after step 1303, then the process determines whether there are other pass gates in the pass gate file to analyze (step 1304). If the last node in the pass gate file has not been analyzed, the process loops back to step 1301. If the last gate in the pass gate file has been analyzed, then the process loops to step 1305 to print a list of potential I/O nodes, e.g. those nodes that have been marked in the input/output node file. The process is finished at step 1306.

Accordingly, the present invention provides a system and a process for extracting logic from a layout database. With a logic level diagram which is close to complete or complete for a logic block, the process of porting the logic block to a new process technology or new product environment is greatly facilitated.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A process for extraction of logic design information from a transistor level net list stored in memory, comprising:
   processing with data processing resources, the transistor level net list in the memory to define groups of transistors in the transistor level net list, according to whether or not transistors in the transistor level net list are connected to a supply voltage, whether or not transistors in the transistor level net list are connected to a reference voltage, and transistor type;
   analyzing with the data processing resources, the groups of transistors according to the interconnections of the transistors in the respective groups; and
   identifying with the data processing resources, logic units in response to the step of analyzing.

2. The process of claim 1, wherein the groups include a first group of transistors of a first type having a source node coupled to a supply voltage, a second group of transistors of the first type having a source node not coupled to a supply voltage, a third group of transistors of a second type having a source node coupled to a reference voltage, and a fourth group of transistors of the second type having a source node not coupled to a reference voltage.

3. The process of claim 2, wherein the first group consists of p-channel MOS transistors having source terminals coupled to a $V_{DD}$ supply voltage, the second group consists of p-channel MOS transistors having source terminals not coupled to a $V_{DD}$ supply voltage, the third group consists of n-channel MOS transistors having source terminals not coupled to a $V_{SS}$ reference voltage, and the fourth group consists of n-channel MOS transistors having source terminals coupled to a VSS reference voltage.

4. The process of claim 2, wherein the step of analyzing includes determining for at least one of said groups of transistors, respective sets of transistors for particular transistors in said one group, the respective sets including the particular transistor for the set, and transistors from said first through fourth groups for which at least one of the sources and drains of the transistors in said respective sets are coupled to at least one of the sources and drains of other transistors in said respective sets.

5. The process of claim 4, wherein the step of identifying includes determining subsets of transistors in said respective sets, the subsets consisting of transistors in one of said groups which share a gate terminal with a transistor in another of said groups, and classifying the subsets as logic units.

6. The process of claim 5, wherein the step of classifying includes classifying a subset as an inverter if the subset consists of one transistor from the first group and one transistor from the fourth group.

7. The process of claim 5, wherein the step of classifying includes classifying a subset as a NAND gate having n inputs, if the subset consists of n transistors from the first group, n-I transistor(s) from the third group, and one transistor from the fourth group.

8. The process of claim 5, wherein the step of classifying includes classifying a subset as a NOR gate having n inputs, if the subset consists of one transistor from the first group, n−1 transistor(s) from the second group, and n transistors from the fourth group.

9. The process of claim 1, wherein said logic units include inverters, NAND gates, and NOR gates.

10. The process of claim 9, wherein said logic units include latches, pass gates and flip flops.

11. The process of claim 10, wherein the transistor level net list describes elements of a logic block and said logic units include input and output nodes of the logic block.

12. The process of claim 1, including producing a computer readable, gate level description of the logic in response to the identified logic units.

13. A system for extraction of logic design information from a transistor level net list stored in memory, comprising:
   data processing resources which process the transistor level net list in the memory to define groups of transistors in the transistor level net list, according to whether or not transistors in the transistor level net list are connected to a supply voltage, whether or not transistors in the transistor level net list are connected to a reference voltage, and transistor type;
   data processing resources which analyze the groups of transistors according to the interconnections of the transistors in the respective groups to define interconnected sets of transistors; and
   data processing resources which identify logic units in response to the interconnected sets of transistors.

14. The system of claim 13, wherein the groups include a first group of transistors of a first type having a source node coupled to a supply voltage, a second group of transistors of the first type having a source node not coupled to a supply voltage, a third group of transistors of a second type having a source node not coupled to a reference voltage, and a fourth group of transistors of the second type having a source node coupled to a reference voltage.

15. The system of claim 14, wherein the first group consists of p-channel MOS transistors having source terminals coupled to a $V_{DD}$ supply voltage, the second group consists of p-channel MOS transistors having source terminals not coupled to a $V_{DD}$ supply voltage, the third group consists of n-channel MOS transistors having source terminals not coupled to a $V_{SS}$ reference voltage, and the fourth group consists of n-channel MOS transistors having source terminals coupled to a $V_{SS}$ reference voltage.

16. The system of claim 14, wherein the data processing resources which analyze the groups include resources which determine for at least one of said groups of transistors, respective interconnected sets of transistors for particular transistors in said one group, the respective interconnected sets including the particular transistor for the respective interconnected set, and transistors from said first through fourth groups for which at least one of the sources and drains of the transistors in said respective interconnected sets are coupled to at least one of the sources and drains of other transistors in said respective interconnected sets.

17. The system of claim 16, wherein the data processing resources which analyze the groups include resources which determine subsets of transistors in said respective interconnected sets, the subsets consisting of transistors in one of said groups which share a gate terminal with a transistor in another of said groups, and which classify the subsets as logic units.

18. The system of claim 16, wherein the data processing resources which classify the subsets include resources which classify a subset as an inverter if the subset consists of one transistor from the first group and one transistor from the fourth group.

19. The system of claim 16, wherein the data processing resources which classify the subsets include resources which classify a subset as a NAND gate having n inputs, if the subset consists of n transistors from the first group, n–1 transistor(s) from the third group, and one transistor from the fourth group.

20. The system of claim 16, wherein the data processing resources which classify the subsets include resources which classify a subset as a NOR gate having n inputs, if the subset consists of one transistor from the first group, n–1 transistor(s) from the second group, and n transistors from the fourth group.

21. The system of claim 13, wherein said logic units include inverters, NAND gates, and NOR gates.

22. The system of claim 21, wherein said logic units include latches, pass gates and flip flops.

23. The system of claim 22, wherein the transistor level net list describes elements of a logic block and said logic units include input and output nodes of the logic block.

24. The system of claim 13, including resources which produce a computer readable, gate level description of logic defined by the transistor level gate list in response to the identified logic units.

25. A process for extraction of logic design information from a transistor level net list stored in memory, comprising:
processing with data processing resources, the transistor level net list in the memory to define groups of transistors in the transistor level net list, wherein the groups include a first group consisting of p-channel MOS transistors having source terminals coupled to a $V_{DD}$ supply voltage, a second group consisting of p-channel MOS transistors having source terminals not coupled to a $V_{DD}$ supply voltage, a third group consisting of n-channel MOS transistors having source terminals not coupled to a $V_{SS}$ reference voltage, and a fourth group consisting of n-channel MOS transistors having source terminals coupled to a $V_{SS}$ reference voltage;
determining for at least one of said groups of transistors, respective sets of transistors for particular transistors in said one group, the respective sets including the particular transistor for the set, and transistors from said first through fourth groups for which at least one of the sources and drains of the transistors in said respective sets are coupled to at least one of the sources and drains of other transistors in said respective sets;
determining subsets of transistors in said respective sets, the subsets consisting of transistors in one of said groups which share a gate terminal with a transistor in another of said groups, and classifying the subsets as logic units.

26. The process of claim 25, wherein the step of classifying includes classifying a subset as an inverter if the subset consists of one transistor from the first group and one transistor from the fourth group.

27. The process of claim 25, wherein the step of classifying includes classifying a subset as a NAND gate having n inputs, if the subset consists of n transistors from the first group, n–1 transistor(s) from the third group, and one transistor from the fourth group.

28. The process of claim 25, wherein the step of classifying includes classifying a subset as a NOR gate having n inputs, if the subset consists of one transistor from the first group, n–1 transistor(s) from the second group, and n transistors from the fourth group.

29. The process of claim 25, wherein said logic units include inverters, NAND gates, and NOR gates.

30. The process of claim 29, wherein said logic units include latches, pass gates and flip flops.

31. The process of claim 30, wherein the transistor level net list describes elements of a logic block and said logic units include input and output nodes of the logic block.

32. The process of claim 25, including producing a computer readable, gate level description of the logic in response to the identified logic units.

33. A system for extraction of logic design information from a transistor level net list stored in memory, comprising:
data processing resources which process the transistor level net list in the memory to define groups of transistors in the transistor level net list, including a first group consists of p-channel MOS transistors having source terminals coupled to a $V_{DD}$ supply voltage, a second group consists of p-channel MOS transistors having source terminals not coupled to a $V_{DD}$ supply voltage, a third group consists of n-channel MOS transistors having source terminals not coupled to a $V_{SS}$ reference voltage, and a fourth group consists of n-channel MOS transistors having source terminals coupled to a $V_{SS}$ reference voltage;
data processing resources which analyze the groups of transistors according to the interconnections of the transistors in the respective groups to define interconnected sets of transistors, including resources which determine for at least one of said groups of transistors, respective interconnected sets of transistors for particular transistors in said one group, the respective interconnected sets including the particular transistor for the respective interconnected set, and transistors from said first through fourth groups for which at least one of the sources and drains of the transistors in said respective interconnected sets are coupled to at least one of the sources and drains of other transistors in said respective interconnected sets; and
data processing resources which identify logic units in response to the interconnected sets of transistors including resources which determine subsets of transistors in said respective interconnected sets, the subsets consisting of transistors in one of said groups which share a gate terminal with a transistor in another of said groups, and which classify the subsets as logic units.

34. The system of claim 33, wherein the data processing resources which classify the subsets include resources which classify a subset as an inverter if the subset consists of one transistor from the first group and one transistor from the fourth group.

35. The system of claim 33, wherein the data processing resources which classify the subsets include resources which classify a subset as a NAND gate having n inputs, if the subset consists of n transistors from the first group, n−1 transistor(s) from the third group, and one transistor from the fourth group.

36. The system of claim 33, wherein the data processing resources which classify the subsets include resources which classify a subset as a NOR gate having n inputs, if the subset consists of one transistor from the first group, n−1 transistor(s) from the second group, and n transistors from the fourth group.

37. The system of claim 33, wherein said logic units include inverters, NAND gates, and NOR gates.

38. The system of claim 37, wherein said logic units include latches, pass gates and flip flops.

39. The system of claim 38, wherein the transistor level net list describes elements of a logic block and said logic units include input and output nodes of the logic block.

40. The system of claim 33, including resources which produce a computer readable, gate level description of logic defined by the transistor level gate list in response to the identified logic units.

* * * * *